(12) United States Patent
Mori

(10) Patent No.: US 9,754,900 B2
(45) Date of Patent: Sep. 5, 2017

(54) THERMOSETTING ADHESIVE SHEET AND SEMICONDUCTOR DEVICE MANUFACTURING METHOD

(71) Applicant: Dexerials Corporation, Tokyo (JP)

(72) Inventor: Daichi Mori, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/163,200

(22) Filed: May 24, 2016

(65) Prior Publication Data

US 2016/0351510 A1    Dec. 1, 2016

(30) Foreign Application Priority Data

May 27, 2015  (JP) ................................ 2015-108020

(51) Int. Cl.
| | |
|---|---|
| *H01L 21/683* | (2006.01) |
| *H01L 23/00* | (2006.01) |
| *H01L 21/78* | (2006.01) |
| *H01L 23/31* | (2006.01) |
| *H01L 23/544* | (2006.01) |

(52) U.S. Cl.
CPC ........ *H01L 23/562* (2013.01); *H01L 21/6836* (2013.01); *H01L 21/78* (2013.01); *H01L 23/3114* (2013.01); *H01L 23/3157* (2013.01); *H01L 23/544* (2013.01); *H01L 2221/6834* (2013.01); *H01L 2221/68327* (2013.01); *H01L 2221/68336* (2013.01); *H01L 2223/54426* (2013.01); *H01L 2223/54433* (2013.01); *H01L 2223/54486* (2013.01); *H01L 2224/11* (2013.01)

(58) Field of Classification Search
None
See application file for complete search history.

(56) References Cited

U.S. PATENT DOCUMENTS

2014/0091480 A1*  4/2014  Takamoto ........... H01L 21/6836
                                                                    257/778
2015/0325480 A1*  11/2015  Priewasser .............. H01L 21/78
                                                                    438/465

FOREIGN PATENT DOCUMENTS

| JP | 02153930 | * | 6/1990 |
| JP | 2002-280329 A | | 9/2002 |

* cited by examiner

*Primary Examiner* — Asok K Sarkar
(74) *Attorney, Agent, or Firm* — Oliff PLC

(57) ABSTRACT

A thermosetting adhesive sheet comprises a thermosetting binder, a transparent filler having an average primary particle diameter from 1 nm to 1000 nm and a colorant; wherein content of the transparent filler is from 30 to 100 pts. mass with respect to 80 pts. mass of the thermosetting binder and content of the colorant is from 0.5 to 3.0 pts. mass with respect to 80 pts. mass of the thermosetting binder; this thermosetting adhesive sheet is applied to a grinding-side surface of a semiconductor wafer and before dicing the semiconductor wafer. Printing using laser marking is thus made clear enabling excellent laser mark visibility and accurate alignment using infrared light.

14 Claims, 6 Drawing Sheets

THERMOSETTING ADHESIVE SHEET AND SEMICONDUCTOR DEVICE MANUFACTURING METHOD

TECHNICAL FIELD

The present disclosure relates to a thermosetting adhesive sheet which reinforces a semiconductor wafer and a method for manufacturing a semiconductor device in order to prevent cracks during a dicing step.

BACKGROUND ART

In manufacturing processes of semiconductor chips, dicing (individualization) processes cause significant stress in semiconductor wafers. Microcracks have thus occurred in semiconductor wafers which have led to high defect rates.

In order to prevent such a problem, applying a thermosetting adhesive sheet immediately before dicing (after backgrinding) to reinforce the semiconductor wafer has been proposed (for example, refer to PLT 1).

Furthermore, in order to ensure traceability for quality of semiconductor chips, it is desirable to laser-mark information such as a lot number on the thermosetting adhesive sheet. Still further, to enable accurate alignment, it is desirable to read alignment marks on the back surface of the semiconductor to which the thermosetting adhesive is applied.

However, to improve laser mark readability, in the case of adding a coloring agent to the thermosetting adhesive sheet, transparency is reduced and alignment mark readability might be problematic.

CITATION LIST

Patent Literature

PLT 1: Japanese Unexamined Patent Application Publication No. 2002-280329

SUMMARY OF INVENTION

Technical Problem

In view of such problems in the conventional art, the present disclosure provides a thermosetting adhesive sheet and a method for manufacturing a semiconductor device using the same having excellent laser mark visibility and alignment mark readability.

Solution to Problem

In order to solve the aforementioned problems, a thermosetting adhesive sheet to be applied to a grinding-side surface of a semiconductor wafer before dicing the semiconductor wafer according to the present disclosure includes a thermosetting binder, a transparent filler having an average primary particle diameter from 1 nm to 1000 nm, and a colorant; wherein content of the transparent filler is from 30 to 100 pts. mass with respect to 80 pts. mass of the thermosetting binder, and content of the colorant is from 0.5 to 3.0 pts. mass with respect to 80 pts. mass of the thermosetting binder.

Furthermore, a method for manufacturing a semiconductor device according to the present disclosure includes a grinding step of grinding a semiconductor wafer, a thermosetting adhesive sheet application step of applying a thermosetting adhesive sheet to a grinding-side surface of the semiconductor wafer, a curing step of curing the thermosetting adhesive sheet, a dicing tape application step of applying a dicing tape to the surface of the semiconductor wafer to which the thermosetting adhesive sheet is applied, and a dicing step of dicing the semiconductor wafer having the dicing tape applied thereto to obtain individual semiconductor chips; wherein the thermosetting adhesive sheet contains a thermosetting binder, a transparent filler having an average primary particle diameter from 1 nm to 1000 nm, and a colorant, content of the transparent filler is from 30 to 100 pts. mass with respect to 80 pts. mass of the thermosetting binder, and content of the colorant is from 0.5 to 3.0 pts. mass with respect to 80 pts. mass of the thermosetting binder.

Advantageous Effects of Invention

The thermosetting adhesive sheet according to the present disclosure is able to achieve excellent laser mark visibility and alignment mark readability by including a predetermined amount of the transparent filler and the colorant. A high-quality semiconductor device can thus be achieved by using the thermosetting adhesive sheet according to the present disclosure.

DESCRIPTION OF EMBODIMENTS

Embodiments of the present disclosure will now be described in detail according to the following order.
1. Thermosetting Adhesive Sheet
2. Semiconductor Device Manufacturing Method
3. Examples 1. Thermosetting Adhesive Sheet A thermosetting adhesive sheet according to this embodiment is a reinforcing sheet having a thermosetting adhesive layer to be applied to a grinding-side surface of a semiconductor wafer before dicing the semiconductor wafer to reinforce the wafer and prevents cracks therein.

Figure 1:
FIG. 1 is a schematic cross-sectional view illustrating a thermosetting adhesive sheet.

FIG. 1 is a schematic cross-sectional view illustrating a thermosetting adhesive sheet. As illustrated in FIG. 1, a matrix film layer 11 and a thermosetting adhesive layer 12 are laminated in the thermosetting adhesive sheet.

Examples of materials usable as the matrix film layer 11 include plastic films such as those of polyethylene terephthalate, polyethylene, polypropylene and polyester, and porous matrix materials such as those of paper, cloth and nonwoven fabric.

The thermosetting adhesive layer 12 contains a thermosetting binder, a transparent filler having an average primary particle diameter from 1 to 1000 nm and a colorant; content of the transparent filler is from 30 to 100 pts. mass with respect to 80 pts. mass of the thermosetting binder and content of the colorant is from 0.5 to 3.0 pts. mass with respect to 80 pts. mass of the thermosetting binder. Because the transparent filler is exposed in areas of laser-light ablation and reflected light is thereby diffused, and because contrast between laser marking portions and other portions is achieved by the colorant, laser marks are made clearer enabling excellent laser-mark visibility. Furthermore, the transparent filler having an average primary particle diameter of 1 to 1000 nm enables accurate alignment using infrared light.

As the thermosetting binder, (meth)acrylic-type thermosetting binders containing a polymer, a (meth)acrylate and a reaction initiator, or epoxy-type thermosetting binders containing a polymer, an epoxy compound and an epoxy curing agent can be used. Among these, in view of reducing warping in the semiconductor wafer after backgrinding, it is preferable to use a (meth)acrylic-type thermosetting binder, which has a high reaction rate. It should be noted that, in the present disclosure, (meth)acrylate is meant to include acrylic acid esters (acrylates) and methacrylic acid esters (methacrylates).

The (meth)acrylic thermosetting binder preferably contains a polymer having an elastomer, a (meth)acrylate in which polyfunctional (meth)acrylate exceeds 95 wt. % of the total (meth)acrylate content and an organic peroxide having a one-minute half-life temperature of 130° C. or less.

The polymer preferably includes an elastomer and more preferably includes a phenoxy resin and an elastomer. Appropriate flexibility in the thermosetting adhesive sheet after curing is thus enabled.

Examples of usable elastomers include, for example, acrylic-type elastomers, butadiene-type elastomers, ethylene-type elastomers, propylene-type elastomers, and styrene-type elastomers, among others; these may be used individually or in a combination of two or more. Among these, an acrylic-type elastomer having excellent transparency is preferably used. Examples of acrylic elastomers available on the market include, for example, tradename "SG-80H" manufactured by Nagase ChemteX Corporation.

Usable examples of phenoxy resins include fluorene-type phenoxy resins, bisphenol-type phenoxy resins, novolactype phenoxy resins, naphthalene-type phenoxy resins and biphenyl-type phenoxy resins; these may be used individually or in a combination of two or more. Among these, a fluorene-type phenoxy resin exhibiting high heat-resistance is preferably used. Examples of fluorene-type phenoxy resins available on the market include trade name "FX293" manufactured by NIPPON STEEL & SUMIKIN CHEMICAL CO., LTD.

Furthermore, weight average molecular weight (Mw) of the polymer is preferably between 5000 and 150000 and more preferably between 10000 and 80000. If the weight average molecular weight (Mw) is too small, sheet characteristics tend to be degraded, and, if too large, compatibility with other constituents tends to be degraded.

Furthermore, the polymer content is preferably between 5 to 100 pts. mass and more preferably between 10 to 40 pts. mass with respect to 50 pts. mass of (meth)acrylate. Insufficient or excessive polymer content tends to degrade sheet characteristics.

The (meth)acrylic thermosetting binder preferably includes a (meth)acrylate in which polyfunctional (meth)acrylate exceeds 95 wt % of the total (meth)acrylate content and preferably has a polyfunctional (meth)acrylate as a primary constituent. Contraction due to curing of the thermosetting adhesive sheet is thus increased, enabling wafer warping reductions.

Other than polyfunctional (meth)acrylates, examples of monofunctional (meth)acrylates include polyalkylene glycol ester monomers and alkyl (meth)acrylates having branched or linear alkyl groups, among others. Examples of polyalkylene glycol ester monomers include hydroxyethyl (meth)acrylate, hydroxypropyl (meth)acrylate, 4-hydroxy-butyl acrylate, polyethylene glycol mono(meth)acrylate, polypropylene glycol mono(meth)acrylate, polybutylene glycol mono(meth)acrylate and polyethylene glycol polypropylene glycol mono(meth)acrylate, among others; these may be used individually or in a combination of two or more.

Within polyfunctional (meth)acrylates, usable bifunctional (meth)acrylates include tricyclodecanedimethanol di(meth)acrylate, dimethylol-tricyclodecane (meth)acrylate, bisphenol AEO modified di(meth)acrylate, 1,9-diol di(meth)acrylate, 1,10-decanediol di(meth)acrylate, 2-hydroxy-3-acryloyloxypropyl (meth)acrylate, propoxylated bisphenol A di(meth)acrylate, diethylene glycol (meth)acrylate, neopentyl glycol di(meth)acrylate, 1,4-butanediol di(meth)acrylate, polyethylene glycol (200) di(meth)acrylate, tetraethylene glycol di(meth)acrylate, polyethylene glycol (400) di(meth)acrylate, cyclohexane dimethanol di(meth)acrylate, alkoxylated hexane diol di(meth)acrylate, alkoxylated cyclohexane dimethanol di(meth)acrylate, ethoxylated (4) bisphenol A di(meth)acrylate, ethoxylated (10) bisphenol A di(meth)acrylate, polyethylene glycol (600) di(meth)acrylate, alkoxylated neopentyl glycol di(meth)acrylate, dioxane glycol di(meth)acrylate and isocyanuric acid EO-modified di(meth)acrylate, among others; these may be used individually or in a combination of two or more. Among these, in view of reaction and crosslink properties, tricyclodecane dimethanol (meth)acrylate is preferably used. Examples of bifunctional (meth)acrylates available on the market include those manufactured by SHIN-NAKAMURA CHEMICAL CO, LTD., such as trade names "DCP" (tricyclodecane dimethanol dimethacrylate, (meth)acrylic equivalent weight (molecular weight/functional group number)=166) and "A-DCP" (tricyclodecane dimethanol diacrylate, (meth)acrylic equivalent weight (molecular weight/functional group number)=152), among others.

Within polyfunctional (meth)acrylates, examples of usable (meth)acrylates having three or more functional groups include isocyanuric acid EO-modified tri(meth)acrylate, dipentaerythritol hexa(meth)acrylate, pentaerythritol tri(meth)acrylate, EO-modified pentaerythritol tri(meth)acrylate, ε-caprolactone-modified tris-(-2-acryloxyethyl) isocyanurate, trimethylol propane tri(meth)acrylate, ε-caprolactone-modified tris (acroxyethyl) (meth)acrylate, ethoxylated (20) trimethylolpropane tri(meth)acrylate, propoxylated (3) trimethylolpropane tri(meth)acrylate, propoxylated (6) trimethylolpropane tri(meth)acrylate, ethoxylated (9) trimethylolpropane tri(meth)acrylate, propoxylated (3) glyceryl tri(meth)acrylate, ethoxylated (4) pentaerythritol tetraacrylate (meth)acrylate, pentaerythritol tetra (meth)acrylate, ditrimethylolpropane tetra(meth)acrylate, dipentaerythritol penta(meth)acrylate, EO-modified dipentaerythritol penta(meth)acrylate and urethane (meth) acrylates having three to nine functional groups, among others; these may be used individually or in a combination of two or more. Among these, in view of reaction and crosslink properties, isocyanuric acid EO-modified triacrylate and dipentaerythritol hexaacrylate can be preferably used. Examples of (meth)acrylates, having three or more functional groups, available on the market include trade names "M-315" manufactured by The Nippon Synthetic Chemical Industry Co., Ltd. (a compound of isocyanuric acid ethylene oxide modified diacrylate and isocyanuric acid ethylene oxide-modified triacrylate, the content of the isocyanuric acid ethylene oxide-modified diacrylate being from 3 to 13%), (meth)acrylic equivalent weight (molecular weight/functional group number)=approximately 100), "A-DPH" manufactured by SHIN-NAKAMURA CHEMICAL CO, LTD., (dipentaerythritol hexaacrylate, (meth) acrylic equivalent weight (molecular weight/functional group number)=96), and "UV-1700B" manufactured by Nippon Synthetic Chemical Industry Co., Ltd. (meth)acrylic equivalent weight (molecular weight/functional group number)=222), among others.

Regarding polyfunctional (meth)acrylates, despite formally having two or more (meth)acryloyl groups, compounds in which the molecular weight is exceedingly large in proportion to the number of functional groups have a tendency to exhibit properties more similar to the monofunctional acrylates described previously. Accordingly, it is preferable to select a polyfunctional (meth)acrylate with consideration to "the (meth)acrylic equivalent weight (g/eq)" in which the molecular weight is divided by the number of functional groups, or "the number of functional groups per unit molecular weight" in which the number of functional groups is divided by the molecular weight. In the case of selection in consideration of (meth)acrylic equivalent weight (g/eq), it is preferable to use the additive average value of (meth)acrylic equivalent weight, which is the sum of the values obtained by multiplying the (meth)acrylic equivalent weights (g/eq) by the percentage of the total (meth)acrylate content. In the case of selection in consideration of the number of functional groups per unit molecular weight, it is preferable to use the average crosslink density, which is the sum of the values obtained by multiplying the number of functional groups per unit molecular weights by the percentage of the total (meth)acrylate content.

The additive average value of (meth)acrylic equivalent weight is preferably between 80 and 230 g/eq and more preferably between 100 and 200 g/eq. Decreasing additive average values of (meth)acrylic equivalent weights increases shrinkage rate, and increasing additive average values of (meth)acrylic equivalent weights decreases the shrinkage rate. Thus, insufficient additive average values of (meth)acrylic equivalent weight tend to degrade semiconductor wafer adhesion characteristics and excessive values lead to difficulties in cancelling out semiconductor wafer warping.

Average crosslink density of the (meth)acrylate is preferably between 2.0E-03 and 5.0E-02 and more preferably between 5.0E-03 and 1.0E-02. Decreasing average crosslink density decreases the shrinkage, and increasing average crosslink density increases the shrinkage. Consequently, if the average cross-linking point number is too small, it is difficult to cancel out semiconductor wafer warping and, if too large, characteristics such as adherence to the semiconductor wafer tend to be degraded.

Furthermore, (meth)acrylate content is preferably from 10 to 100 pts. mass and more preferably from 20 to 70 pts. mass with respect to 25 pts. mass of polymer. Insufficient (meth) acrylate content leads to difficulties in cancelling out semiconductor wafer warping and, excessive content tends to degrade sheet characteristics.

The one-minute half-life temperature of the organic peroxide is preferably 130° C. or less and more preferably between 80° C. and 120° C. If the one-minute half-life temperature is excessive, it is difficult to obtain a high reaction rate and, if insufficient, storage stability under room temperature tends to be degraded.

Examples of usable organic peroxides include dilauroyl peroxide (one-minute half-life temperature 116.4° C.), dibenzoyl peroxide (one-minute half-life temperature 130.0° C.), di(4-methylbenzoyl) peroxide (one-minute half-life temperature 128.2° C.), 1,1,3,3-tetramethylbutyl peroxy-2-ethylhexanoate (one-minute half-life temperature 124.3° C.), di(3,5,5-trimethyl hexanoyl) peroxide (one-minute half-life temperature 112.6° C.), t-butyl peroxypivalate (one-minute half-life temperature 110.3° C.), t-hexyl peroxypivalate (one-minute half-life temperature 109.1° C.), t-butyl peroxyneoheptanoate (one-minute half-life temperature 104.6° C.), t-butyl peroxyneodecanoate (one-minute half-life temperature 103.5° C.), t-hexyl peroxyneodecanoate (one-minute half-life temperature 100.9° C.), di(2-ethylhexyl) peroxydicarbonate (one-minute half-life temperature 90.6° C.), di(4-t-butylcyclohexyl) peroxydicarbonate (one-minute half-life temperature 92.1° C.), 1,1,3,3-tetramethylbutyl peroxyneodecanoate (one-minute half-life temperature 92.1° C.), diisobutyryl peroxide (one-minute half-life temperature 85.1° C.), di-sec-butyl peroxydicarbonate (one-minute half-life temperature 85.1° C.), di-n-propyl peroxydicarbonate (one-minute half-life temperature 85.1° C.) and cumyl peroxyneodecanoate (one-minute half-life temperature 85.1° C.), among others; these may be used individually or in a combination of two or more. Among these in view of reaction and crosslinking properties, dilauroyl peroxide and 1,1,3,3-tetramethylbutyl peroxy-2-ethylhexanoate are preferably used. Examples of dilauroyl peroxides available on the market include trade name PEROYL L manufactured by NOF CORPORATION, among others, and examples of 1,1,3,3-tetra-methyl butyl peroxy-2-ethylhexanoate available on the market include trade name PEROCTA O manufactured by NOF CORPORATION, among others.

Organic peroxide content is preferably from 0.1 to 20 pts. mass and more preferably from 1 to 10 pts. mass with respect to 50 pts. mass of (meth)acrylate. Insufficient organic peroxide content degrades reaction properties and excessive content tends to reduce life time of the product.

The transparent filler has an average primary particle diameter from 1 to 1000 nm and is contained from 30 to 100 pts. mass with respect to 80 pts. mass of the thermosetting binder. Transparent fillers having an average primary particle diameter of less than 1 nm are expensive and difficult to obtain, and an average primary particle diameter exceeding 1000 nm degrades light transparency, thereby degrading alignment mark readability. Furthermore, in the case of insufficient transparent filler content, laser mark visibility improvement effects are unachievable, and, in the case of excessive transparent filler content, alignment mark readability is degraded and adhesion reliability of the thermosetting adhesive sheet is degraded. It should be noted that "primary particle" is meant to represent the smallest particle that can exist singly and that "average primary particle diameter" is meant to represent the average value of the major axes of primary particles observed by a scanning electron microscope.

Inorganic or organic materials can be used as the transparent filler and it is preferable to use a material that is transparent to infrared light used in alignment. Usable examples of materials transparent to infrared light include silica, silicon, germanium, quartz and sapphire, among others; these may be used individually or in a combination of two or more. Among these, in view of laser mark visibility, silica is preferably used.

The colorant generates contrast between laser marking portions and other portions leading to improvements in laser mark visibility. Examples of materials usable as such a colorant include carbon black, titanium black, titanium oxide and iron oxide, among others; these may be used individually or in a combination of two or more. Among these, in view of contrast improvement, carbon black is preferably used.

Additionally, as another additive, it is preferable to add a silane coupling agent. Usable silane coupling agents include methacrylic-type, epoxy-type, amino-type, mercapto-type, sulfide-type and ureido-type; however, in the case of using a (meth)acrylic-type thermosetting binder, a (meth)acrylic silane coupling agent is preferably used and, in the case of using an epoxy-type thermosetting binder, an epoxy-type silane coupling agent is preferably used. Adhesion reliability at interfaces between organic and inorganic materials can be improved thereby.

Transmittance of 1000 nm wavelength light of the thermosetting adhesive sheet is preferably 30% or more. Insufficient infrared transmittance leads to difficulties in alignment using infrared.

In the thermosetting adhesive sheet according to this embodiment, because a predetermined amount of transparent filler and colorant are added as described above, excellent laser mark visibility and alignment mark readability are achievable. Furthermore, by using a (meth)acrylic thermosetting binder containing a polyfunctional (meth)acrylate, it is possible to reduce semiconductor wafer warping, thereby enabling improvements in production efficiency for high-quality semiconductor devices.

2. Semiconductor Device Manufacturing Method

Next, a method for manufacturing a semiconductor device using the aforementioned thermosetting adhesive sheet will now be described. A method for manufacturing a semiconductor device according to this embodiment includes a grinding step of grinding a semiconductor wafer, a thermosetting adhesive sheet application step of applying a thermosetting adhesive sheet to a grinding-side surface of the semiconductor wafer, a curing step of curing the thermosetting adhesive sheet, a dicing tape application step of applying a dicing tape to the surface of the semiconductor wafer to which the thermosetting adhesive sheet is applied and a dicing step of dicing the semiconductor wafer having the dicing tape applied thereto to obtain individual semiconductor chips. Furthermore, the thermosetting adhesive sheet includes a thermosetting binder, a transparent filler having an average primary particle diameter from 1 nm to 1000 nm, and a colorant, content of the transparent filler is from 30 to 100 pts. mass with respect to 80 pts. mass of the thermosetting binder, and content of the colorant is from 0.5 to 3.0 pts. mass with respect to 80 pts. mass of the thermosetting binder. Because excellent laser mark visibility and alignment mark readability are enabled thereby, accurate traceability and alignment are enabled, thus allowing for improvements in manufacturing productivity for high-quality semiconductor devices.

An example method for manufacturing a semiconductor device will now be described. The example method for manufacturing a semiconductor device includes (A) a protective tape application step, (B) a grinding step, (C) a thermosetting adhesive sheet application step, (D) a protective tape peeling step, (E) a curing step, (F) an adhesive tape application step, (G) a dicing step, (H) an expanding step, (I) a picking-up step and (J) a mounting step. It should be noted that the protective tape peeling step (D) may be performed before the thermosetting adhesive sheet application step (C).

(A) Protective Tape Application Step

Figure 2:
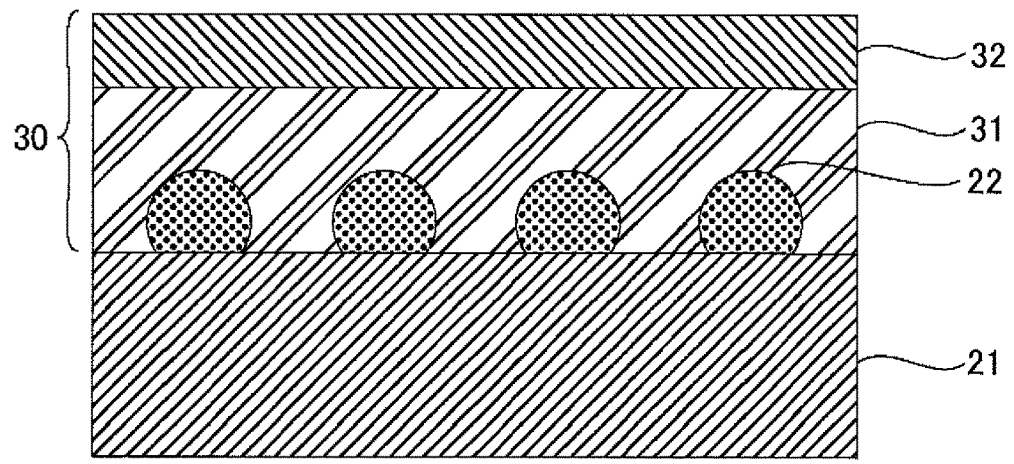
FIG. 2 is a schematic cross-sectional view illustrating a BG tape application step.

FIG. 2 is a schematic cross-sectional view illustrating a protective tape application step. In the protective tape application step, a protective tape 30 is applied to a surface of a wafer 21 having protruding electrodes 22 formed thereon. An application temperature for applying the protective tape 30, in view of reducing voids, improving wafer adhesion properties and preventing warping of the wafer after grinding, is preferably from 25 to 100° C. and more preferably from 40 to 80° C.

The wafer 21 includes an integrated circuit formed on a semiconductor surface such as silicon and the protruding electrodes 22 which are known as a bumps and are used for making connections. Thickness of the wafer 21 is without particular limitation but is preferably from 200 to 10000 μm.

Without particular limitation, examples of the protruding electrodes 22 include solder-including low-melting point bumps or high-melting point bumps, tin bumps, silver-tin bumps, silver-tin-copper bumps, gold bumps and copper bumps, among others. Furthermore, height of the protruding electrodes 22 is without particular limitation but is preferably from 10 to 200 μm.

The protective tape 30 is known as backgrind tape and protects the wafer from scratches, cracks and contamination in the following grinding step (B). As illustrated in FIG. 2, in the protective tape 30, a thermoplastic resin layer 31 and a matrix film layer 32 are laminated, the protective tape 30 is applied so that the thermoplastic resin layer 31 contacts the surface on which the protruding electrodes 22 are formed and the protruding electrodes 22 embed into the thermoplastic resin layer 31.

Examples usable as the thermoplastic resin layer 31 include EVA (ethylene vinyl acetate), polyethylene, polypropylene, polyamide, polyacetal, polyethylene terephthalate, a polybutylene terephthalate, fluoropolymer, polyphenylene sulfide, polystyrene, ABS resin, acrylic-type resin, polycarbonate, polyurethane, polyvinyl chloride, polyphenylene oxide, among others; these may be used individually or in a combination of two or more.

Furthermore, the shear storage modulus at 60° C. for the thermoplastic resin layer 31 is preferably 1.0E+07 Pa or less. A shear storage modulus at 60° C. of 1.0E+07 Pa or less for the thermoplastic resin layer 31 enables improvements in bump-embedding properties in the thermoplastic resin layer 31.

Examples of materials usable as the matrix film layer 32 include plastic films such as those of polyethylene terephthalate, polyethylene, polypropylene and polyester, and porous substrates such as those of paper, cloth and nonwoven fabric.

It should be noted that the protective tape 30 is not limited to the aforementioned configuration and other layers may be formed on the surface of any layer or between any adjacent layers.

(B) Grinding Step

Figure 3:
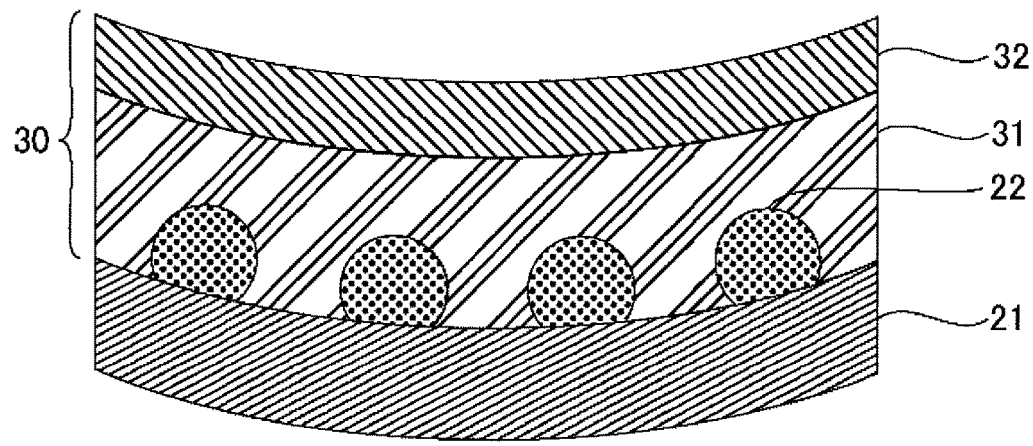
FIG. 3 is a schematic cross-sectional view illustrating a grinding step.

FIG. 3 is a schematic cross-sectional view illustrating a grinding step. In the grinding step, grinding is performed on the surface opposite to the surface to which the protective tape 30 is applied. The surface of the wafer 21 opposite to the protective tape 30 application-side is secured to a grinding device and is ground. In this grinding step, the wafer 21 is ground to a thickness of 200 μm or less, or further, 50 μm or less. Decreasing thickness of the wafer 21 increases warping in the wafer 21. It should be noted that warping of the wafer 21 is measured as the maximum value of the warp (z-axis) when the wafer 21 is placed on a plane stage (x-y plane).

(C) Thermosetting Adhesive Sheet Application Step

Figure 4:
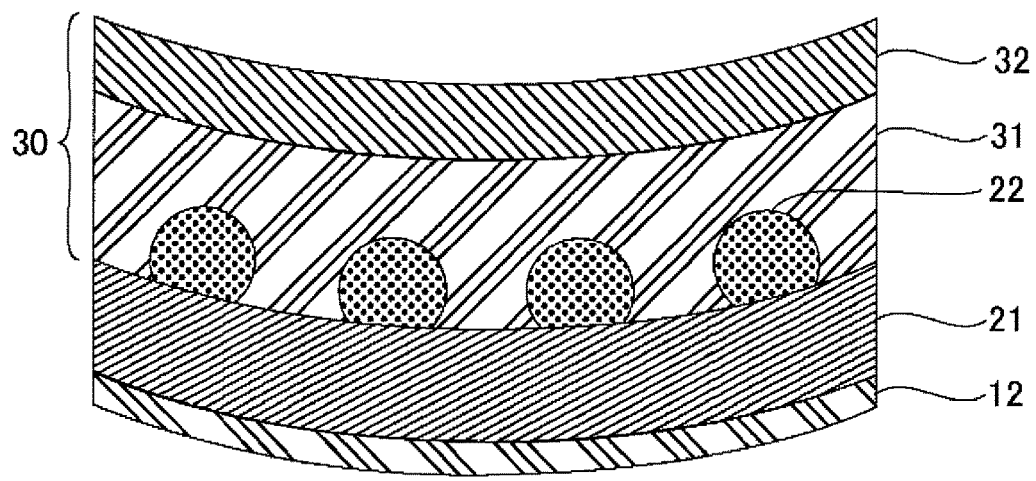
FIG. 4 is a schematic cross-sectional view illustrating a thermosetting adhesive sheet application step.

FIG. 4 is a schematic cross-sectional view illustrating a thermosetting adhesive sheet application step. In the thermosetting adhesive sheet application step, a thermosetting adhesive layer 12 of the thermosetting adhesive sheet is applied to the grinding-side surface of the wafer 21.

(D) Protective Tape Peeling Step

Figure 5:
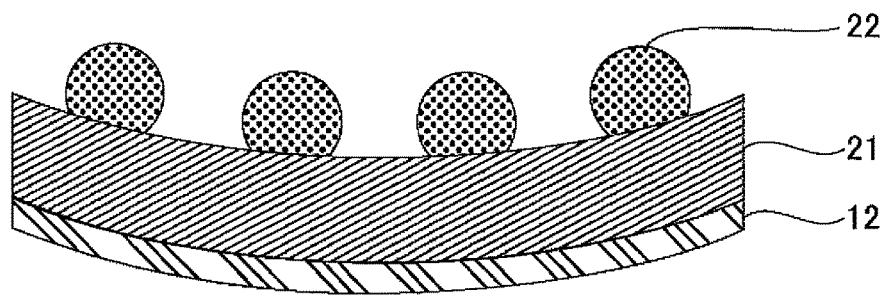
FIG. 5 is a schematic cross-sectional view illustrating a BG tape peeling step.

FIG. 5 is a schematic cross-sectional view illustrating a protective tape peeling step. In the protective tape peeling step, the protective tape 30 is peeled.

(E) Curing Step

Figure 6:
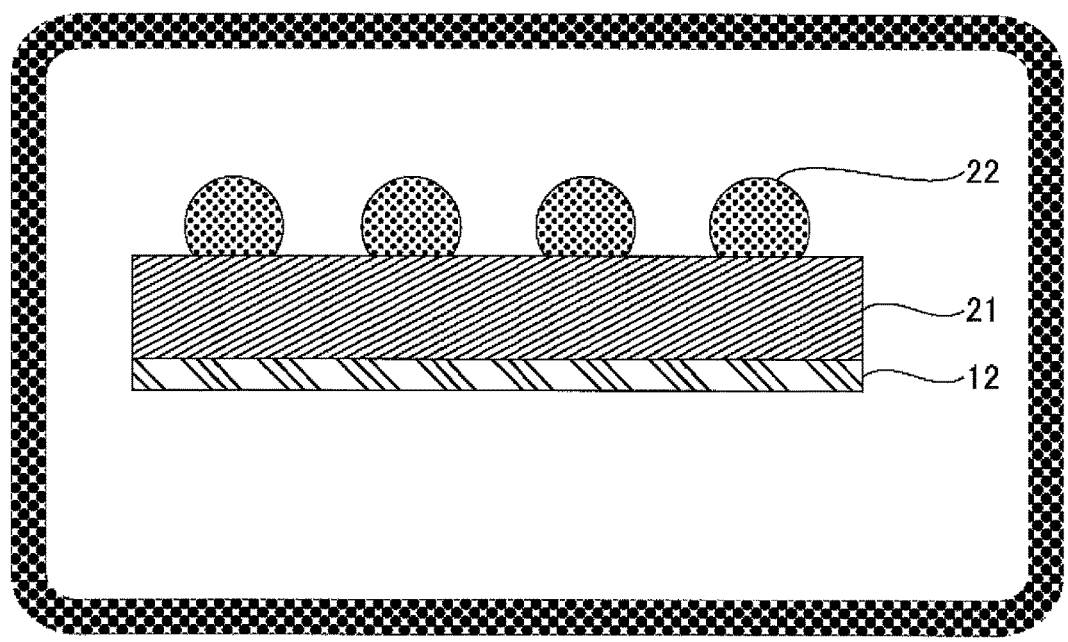
FIG. 6 is a schematic cross-sectional view illustrating a curing step.

FIG. 6 is a schematic cross-sectional view illustrating a curing step. In the curing step, the thermosetting adhesive layer 12 is cured. As a curing method and curing conditions, known methods for curing thermosetting adhesive agents may be used. In the curing step, for example, it is possible to cure the thermosetting adhesive layer 12 by curing at a temperature between 80 and 180° C. for 0.1 to 5 hours. The thermosetting adhesive layer 12 significantly shrinks and because stress opposing the warp direction of the wafer 21 is generated, it is thus possible to maintain flatness of the wafer 21.

Furthermore, it is possible to use laser marking to print such information as a lot number onto the thermosetting adhesive layer 12 after the curing step 12. Particularly, reducing semiconductor wafer warping enables accurate laser-light focusing making high-accuracy printing possible.

(F) Adhesive Tape Application Step

Figure 7:
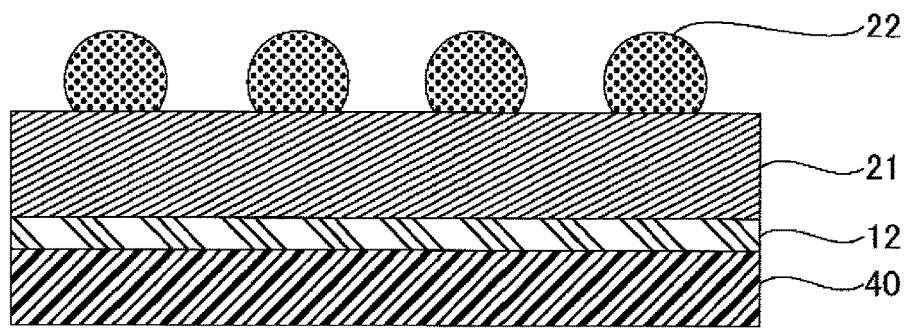
FIG. 7 is a schematic cross-sectional view illustrating a DC tape application step.

FIG. 7 is a schematic cross-sectional view illustrating an adhesive tape application step. In the adhesive tape application step, an adhesive tape 40 is applied to the grinding-side surface. The adhesive tape 40, which is known as dicing tape, protects and secures the wafer 21 from the dicing step (G) until the picking-up step (I).

The adhesive tape 40 is without particular limitations and those commonly known may be used. Generally, the adhesive tape 40 includes an adhesive layer and a matrix film layer. Examples usable as the adhesive layer include polyethylene-based, acrylic-based, rubber-based and urethane-based adhesives, among others. Examples of materials usable as the matrix film layer include plastic films such as those of polyethylene terephthalate, polyethylene, polypropylene and polyester, and porous substrates such as those of paper, cloth and nonwoven fabric. The application device and conditions for applying the adhesive tape are without particular limitations and commonly known devices and conditions may be used.

(G) Dicing Step

Figure 8:
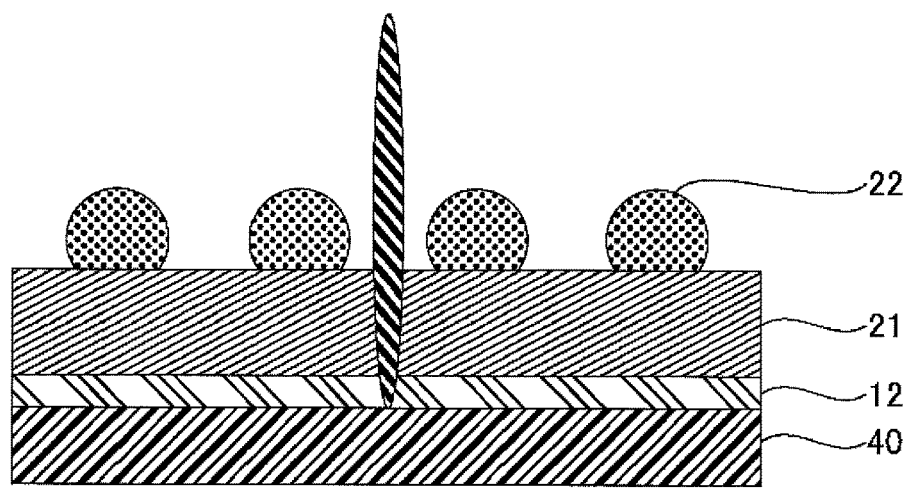
FIG. 8 is a schematic cross-sectional view illustrating a dicing step.

FIG. 8 is a schematic cross-sectional view illustrating a dicing step. In the dicing step, dicing is performed on the wafer 21 having the adhesive tape 40 applied thereto to obtain individual semiconductor chips. The dicing method is without particular limitation and known methods such as, for example, cutting apart the wafer 21 with a dicing saw, may be used.

(H) Expanding Step

Figure 9:
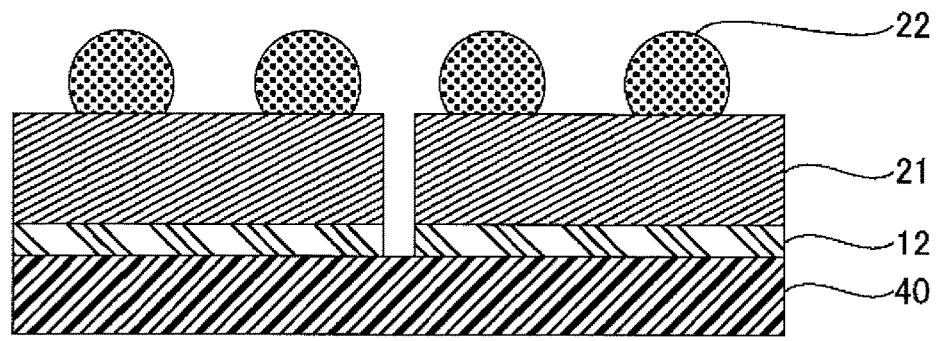
FIG. 9 is a schematic cross-sectional view illustrating an expanding step.

FIG. 9 is a schematic cross-sectional view illustrating an expanding step. In the expanding step, for example, the adhesive tape 40 having the separated individual semiconductor chips adhered thereon is expanded in the radial direction to increase distances between the individual semiconductor chips.

(I) Picking-up Step

Figure 10:
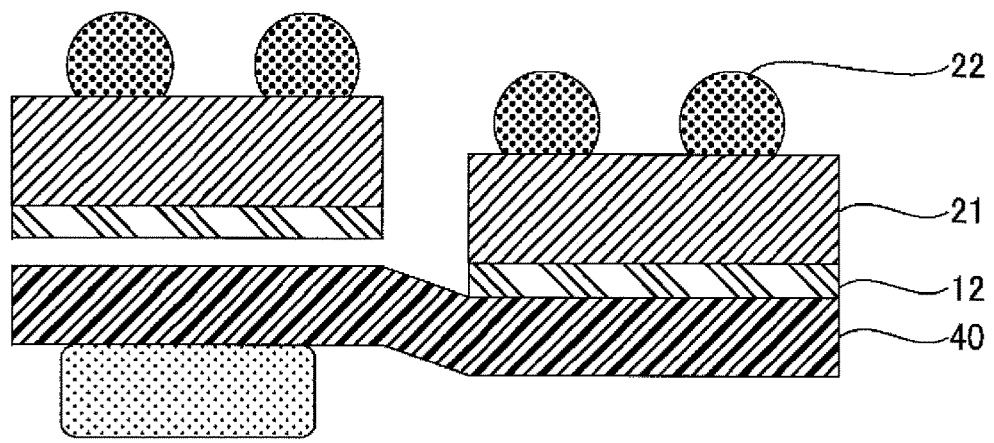
FIG. 10 is a schematic cross-sectional view illustrating a picking-up step.

FIG. 10 is a schematic cross-sectional view illustrating a picking-up step. In the picking-up step, the semiconductor chips secured by adhesion on the adhesive tape 40 are detached from the adhesive tape 40 by pressing upwards on the underside surface thereof and the detached semiconductor chips are sucked by a collet. After pick-up, the semiconductor chips are collected in a chip tray or are conveyed to a chip-mounting nozzle of a flip-chip bonder.

(J) Mounting Step

Figure 11:
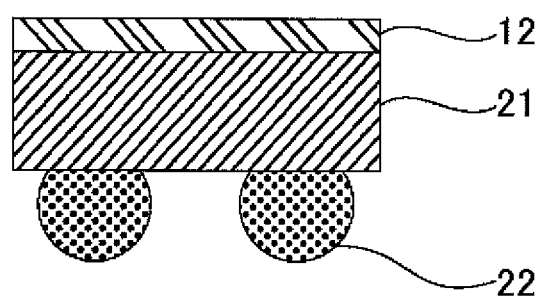
FIG. 11 is a schematic cross-sectional view illustrating a mounting step.

FIG. 11 is a schematic cross-sectional view illustrating a mounting step. In the mounting step, for example, the semiconductor chip and a circuit substrate are connected by using a circuit connecting material such as NCF (non conductive film). Materials used as the circuit substrate are without particular limitation and usable examples include plastic substrates such as polyimide substrates and glass epoxy substrates and ceramic substrates, among others. As a connection method, known methods such as those using thermal-bonding or reflow ovens can be used.

In the method for manufacturing a semiconductor device according to this embodiment, by using the aforementioned thermosetting adhesive sheet, because excellent laser mark visibility and alignment mark readability are enabled, accurate traceability and alignment are made possible allowing for improvements in manufacturing productivity for high-quality semiconductor devices.

Furthermore, because semiconductor wafer warping is reduced by the thermosetting adhesive sheet being applied and cured on the grinding-side surface of the semiconductor wafer, dicing can be easily performed enabling manufacturing productivity improvements.

Still further, in the semiconductor device obtained by mounting, because the semiconductor chip has the thermosetting adhesive layer on the grinding-side surface thereof and an adhesive agent layer on the surface having the projecting electrodes, excellent connection reliability can be achieved.

EXAMPLES

3. Examples

Examples according to the present disclosure will now be described.

3.1 First Examples

In the first examples, thermosetting adhesive sheets were manufactured and laser mark visibility and alignment mark readability were evaluated.

Thermosetting Adhesive Sheet Manufacture

The constituents listed below were blended to prepare resin compositions. These were then applied to release-treated PET (polyethylene terephthalate) by using a bar coater which was then dried in an oven at 80° C. for 3 minutes to manufacture thermosetting adhesive sheets having a thickness of 20 μm (cover release-treated PET (25 μm))/thermosetting adhesive sheet (20 μm)/base release-treated PET (50 μm).

FX293: fluorene-type phenoxy resin (manufactured by NIPPON STEEL & SUMIKIN CHEMICAL CO., LTD.)

SG-80H: acrylic elastomer (manufactured by Nagase ChemteX Corporation)

4-HBA: 4-hydroxy-butyl acrylate (manufactured by SHIN-NAKAMURA CHEMICAL CO, LTD., (meth)acrylic equivalent weight (molecular weight/number of functional groups)=144)

CEL-2021P: alicyclic epoxy resin (manufactured by Daicel Corporation)

PEROYL L: Dilauroyl peroxide (manufactured by NOF CORPORATION, one-minute half-life temperature 116.4° C.)

TD-2131: phenol novolac (manufactured by DIC CORPORATION)

U-CAT5002: DBU-type tetraphenylborate salt (San-Apro Ltd.)

silica (primary particle diameter: 1 nm, 50 nm, 100 nm, 1000 nm and 1100 nm)

20: carbon black

KBM-5103: acrylic silane coupling agent (Shin-Etsu Chemical Co., Ltd.)

KBM-403: epoxy-type silane coupling agent (Shin-Etsu Chemical Co., Ltd.)

Thermosetting Adhesive Sheet Laser Mark Visibility Evaluation

A laser marking device was used to print numbers onto the thermosetting adhesive sheets, which had a thickness of 20 μm and which were cured under conditions of 130° C. for one hour. Under visual inspection, those having readable numbers and good contrast were evaluated as Very Good (hereinafter represented as VG), those having readable numbers where otherwise evaluated as Good (hereinafter represented as G), and those not having readable numbers were evaluated as Fail (hereinafter represented as F).

Thermosetting Adhesive Sheet Alignment Mark Readability Evaluation.

Transmittance of infrared light (wavelength: 1 μm) was measured in thermosetting adhesive sheets, which had a thickness of 20 μm and which were cured under conditions of 130° C. for one hour. An IR transmittance of 50% or more was evaluated as VG, a transmittance of 30% or more and less than 50% was evaluated as G and a transmittance of less than 30% was evaluated as F.

Example 1

A thermosetting binder was prepared having 5 pts. mass of a fluorene-type phenoxy resin (FX293), 20 pts. mass of an acrylic-type elastomer (SG-80H), 50 pts. mass of a monofunctional acrylate (4-HBA) and 5 pts. mass of an organic peroxide (PEROYL L). To 80 pts. mass of this thermosetting binder, 50 pts. mass of silica (primary particle diameter: 100 nm), 0.5 pts. mass of carbon black and 2 pts. mass of an acrylic-type coupling agent (KBM-5103) were blended and thermosetting adhesive sheets were manufactured.

As represented in Table 1, transmittance of the thermosetting adhesive sheets for a wavelength of 1000 nm was 50%. Moreover, the laser mark visibility evaluation was G and the alignment mark readability evaluation was VG.

Example 2

A thermosetting binder was prepared having 5 pts. mass of a fluorene-type phenoxy resin (FX293), 20 pts. mass of an acrylic-type elastomer (SG-80H), 50 pts. mass of an alicyclic epoxy resin (CEL-2021) and 5 pts. mass of a phenol novolac (TD-2131) as a curing agent. To 80 pts. mass of this thermosetting binder, 5 pts. mass of a DBU-type tetraphenylborate salt (U-CAT 5002) as an auxiliary curing agent, 50 pts. mass of silica (primary particle diameter: 100 nm), 0.5 pts. mass of carbon black and 2 pts. mass of an acrylic-type coupling agent (KBM-403) were blended and thermosetting adhesive sheets were manufactured.

As represented in Table 1, transmittance of the thermosetting adhesive sheets for a wavelength of 1000 nm was 50%. Moreover, the laser mark visibility evaluation was G and the alignment mark readability evaluation was VG.

Example 3

To 80 pts. mass of the thermosetting binder described in Example 1, 50 pts. mass of silica (primary particle diameter: 1 nm), 0.5 pts. mass of carbon black and 2 pts. mass of an acrylic-type coupling agent (KBM-5103) were blended and thermosetting adhesive sheets were manufactured.

As represented in Table 1, transmittance of the thermosetting adhesive sheets for a wavelength of 1000 nm was 60%. Moreover, the laser mark visibility evaluation was G and the alignment mark readability evaluation was VG.

Example 4

To 80 pts. mass of the thermosetting binder described in Example 1, 50 pts. mass of silica (primary particle diameter: 1000 nm), 0.5 pts. mass of carbon black and 2 pts. mass of an acrylic-type coupling agent (KBM-5103) were blended and thermosetting adhesive sheets were manufactured.

As represented in Table 1, transmittance of the thermosetting adhesive sheets for a wavelength of 1000 nm was 30%. Moreover, the laser mark visibility evaluation was G and the alignment mark readability evaluation was G.

Example 5

To 80 pts. mass of the thermosetting binder described in Example 1, 50 pts. mass of silica (primary particle diameter: 50 nm), 0.5 pts. mass of carbon black and 2 pts. mass of an acrylic-type coupling agent (KBM-5103) were blended and thermosetting adhesive sheets were manufactured.

As represented in Table 1, transmittance of the thermosetting adhesive sheets for a wavelength of 1000 nm was 60%. Moreover, the laser mark visibility evaluation was G and the alignment mark readability evaluation was VG.

Example 6

To 80 pts. mass of the thermosetting binder described in Example 1, 100 pts. mass of silica (primary particle diameter: 50 nm), 0.5 pts. mass of carbon black and 2 pts. mass of an acrylic-type coupling agent (KBM-5103) were blended and thermosetting adhesive sheets were manufactured.

As represented in Table 1, transmittance of the thermosetting adhesive sheets for a wavelength of 1000 nm was 50%. Moreover, the laser mark visibility evaluation was G and the alignment mark readability evaluation was VG.

Example 7

To 80 pts. mass of the thermosetting binder described in Example 1, 30 pts. mass of silica (primary particle diameter: 50 nm), 0.5 pts. mass of carbon black and 2 pts. mass of an acrylic-type coupling agent (KBM-5103) were blended and thermosetting adhesive sheets were manufactured.

As represented in Table 1, transmittance of the thermosetting adhesive sheets for a wavelength of 1000 nm was 70%. Moreover, the laser mark visibility evaluation was G and the alignment mark readability evaluation was VG.

Example 8

To 80 pts. mass of the thermosetting binder described in Example 1, 50 pts. mass of silica (primary particle diameter: 50 nm), 3 pts. mass of carbon black and 2 pts. mass of an acrylic-type coupling agent (KBM-5103) were blended and thermosetting adhesive sheets were manufactured.

As represented in Table 1, transmittance of the thermosetting adhesive sheets for a wavelength of 1000 nm was 30%. Moreover, the laser mark visibility evaluation was VG and the alignment mark readability evaluation was G.

Example 9

To 80 pts. mass of the thermosetting binder described in Example 1, 50 pts. mass of silica (primary particle diameter: 50 nm), 1.5 pts. mass of carbon black and 2 pts. mass of an acrylic-type coupling agent (KBM-5103) were blended and thermosetting adhesive sheets were manufactured.

As represented in Table 1, transmittance of the thermosetting adhesive sheets for a wavelength of 1000 nm was 40%. Moreover, the laser mark visibility evaluation was VG and the alignment mark readability evaluation was G.

Comparative Example 1

To 80 pts. mass of the thermosetting binder described in Example 1, 50 pts. mass of silica (primary particle diameter: 1100 nm), 1.5 pts. mass of carbon black and 2 pts. mass of an acrylic-type coupling agent (KBM-5103) were blended and thermosetting adhesive sheets were manufactured.

As represented in Table 2, transmittance of the thermosetting adhesive sheets for a wavelength of 1000 nm was 20%. Moreover, the laser mark visibility evaluation was G and the alignment mark readability evaluation was F.

Comparative Example 2

To 80 pts. mass of the thermosetting binder described in Example 2, 5 pts. mass of a DBU-type tetraphenylborate salt (U-CAT 5002) as an auxiliary curing agent, 50 pts. mass of silica (primary particle diameter: 1100 nm), 1.5 pts. mass of carbon black and 2 pts. mass of an acrylic-type coupling agent (KBM-403) were blended and thermosetting adhesive sheets were manufactured.

As represented in Table 2, transmittance of the thermosetting adhesive sheets for a wavelength of 1000 nm was 20%. Moreover, the laser mark visibility evaluation was G and the alignment mark readability evaluation was F.

Comparative Example 3

To 80 pts. mass of the thermosetting binder described in Example 1, 120 pts. mass of silica (primary particle diameter: 50 nm), 1.5 pts. mass of carbon black and 2 pts. mass of an acrylic-type coupling agent (KBM-5103) were blended and thermosetting adhesive sheets were manufactured.

As represented in Table 2, transmittance of the thermosetting adhesive sheets for a wavelength of 1000 nm was 20%. Moreover, the laser mark visibility evaluation was G and the alignment mark readability evaluation was F.

Comparative Example 4

To 80 pts. mass of the thermosetting binder described in Example 1, 20 pts. mass of silica (primary particle diameter: 50 nm), 1.5 pts. mass of carbon black and 2 pts. mass of an acrylic-type coupling agent (KBM-5103) were blended and thermosetting adhesive sheets were manufactured.

As represented in Table 2, transmittance of the thermosetting adhesive sheets for a wavelength of 1000 nm was 80%. Moreover, the laser mark visibility evaluation was F and the alignment mark readability evaluation was VG.

Comparative Example 5

To 80 pts. mass of the thermosetting binder described in Example 1, 50 pts. mass of silica (primary particle diameter: 50 nm), 4.0 pts. mass of carbon black and 2 pts. mass of an acrylic-type coupling agent (KBM-5103) were blended and thermosetting adhesive sheets were manufactured.

As represented in Table 2, transmittance of the thermosetting adhesive sheets for a wavelength of 1000 nm was 10%/a. Moreover, the laser mark visibility evaluation was VG and the alignment mark readability evaluation was F.

Comparative Example 6

To 80 pts. mass of the thermosetting binder described in Example 1, 50 pts. mass of silica (primary particle diameter: 50 nm), 0.3 pts. mass of carbon black and 2 pts. mass of an acrylic-type coupling agent (KBM-5103) were blended and thermosetting adhesive sheets were manufactured.

As represented in Table 2, transmittance of the thermosetting adhesive sheets for a wavelength of 1000 nm was 70%. Moreover, the laser mark visibility evaluation was F and the alignment mark readability evaluation was VG.

TABLE 1

| Component | Trade Name | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| fluorene type phenoxy resin | FX293 | 5 | 5 | 5 | 5 | 5 | 5 | 5 | 5 | 5 |
| acrylic elastomer | SG-80H | 20 | 20 | 20 | 20 | 20 | 20 | 20 | 20 | 20 |
| monofunctional acrylate | 4-HBA | 50 | — | 50 | 50 | 50 | 50 | 50 | 50 | 50 |
| alicyclic epoxy resin | CEL-2021P | — | 50 | — | — | — | — | — | — | — |
| dilauroyl peroxide | PEROYL L | 5 | — | 5 | 5 | 5 | 5 | 5 | 5 | 5 |
| phenol novolac | TD-2131 | — | 5 | — | — | — | — | — | — | — |
| DBU-type tetraphenylborate salt | U-CAT 5002 | — | 5 | — | — | — | — | — | — | — |
| silica (primary particle diameter: 1 nm) | | — | — | 50 | — | — | — | — | — | — |
| silica (primary particle diameter: 50 nm) | | — | — | — | — | 50 | 100 | 30 | 50 | 50 |
| silica (primary particle diameter: 100 nm) | | 50 | 50 | — | — | — | — | — | — | — |
| silica (primary particle diameter: 1000 nm) | | — | — | — | 50 | — | — | — | — | — |
| silica (primary particle diameter: 1100 nm) | | — | — | — | — | — | — | — | — | — |
| carbon black | #20 | 0.5 | 0.5 | 0.5 | 0.5 | 0.5 | 0.5 | 0.5 | 3.0 | 1.5 |

TABLE 1-continued

| Component | Trade Name | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| acrylic-type silane coupling agent | KBM-5103 | 2 | — | 2 | 2 | 2 | 2 | 2 | 2 | 2 |
| epoxy-type silane coupling agent | KBM-403 | — | 2 | — | — | — | — | — | — | — |
| Transmittance (%) Wavelength: 1 μm | | 50 | 50 | 60 | 30 | 60 | 50 | 70 | 30 | 40 |
| Laser Mark Visibility Evaluation | | G | G | G | G | G | G | G | VG | VG |
| Alignment Mark Readability Evaluation | | VG | VG | VG | G | VG | VG | VG | G | G |

TABLE 2

| Component | Trade Name | Comp. 1 | Comp. 2 | Comp. 3 | Comp. 4 | Comp. 5 | Comp. 6 |
|---|---|---|---|---|---|---|---|
| fluorene-type phenoxy resin | FX293 | 5 | 5 | 5 | 5 | 5 | 5 |
| acrylic elastomer | SG-80H | 20 | 20 | 20 | 20 | 20 | 20 |
| monofunctional acrylate | 4-HBA | 50 | — | 50 | 50 | 50 | 50 |
| alicyclic epoxy resin | CEL-2021P | — | 50 | — | — | — | — |
| dilauroyl peroxide | PEROYL L | 5 | — | 5 | 5 | 5 | 5 |
| phenol novolac | TD-2131 | — | 5 | — | — | — | — |
| DBU-type tetraphenylborate salt | U-CAT 5002 | — | 5 | — | — | — | — |
| silica (primary particle diameter: 1 nm) | | — | — | — | — | — | — |
| silica (primary particle diameter: 50 nm) | | — | — | 120 | 20 | 50 | 50 |
| silica (primary particle diameter: 100 nm) | | — | — | — | — | — | — |
| silica (primary particle diameter: 1000 nm) | | — | — | — | — | — | — |
| silica (primary particle diameter: 1100 nm) | | 50 | 50 | — | — | — | — |
| carbon black | #20 | 1.5 | 1.5 | 1.5 | 1.5 | 4.0 | 0.3 |
| acrylic-type silane coupling agent | KBM-5103 | 2 | — | 2 | 2 | 2 | 2 |
| epoxy-type siiane coupling agent | KBM-403 | — | 2 | — | — | — | — |
| Transmittance (%) Wavelength: 1 μm | | 20 | 20 | 20 | 80 | 10 | 70 |
| Laser Mark Visibility Evaluation | | G | G | G | F | VG | F |
| Alignment Mark Readability Evaluation | | F | F | F | VG | F | VG |

As in Comparative Examples 1 and 2, in the case of using silica having an average primary particle diameter of 1100 nm, infrared transmittance was reduced and alignment mark readability was degraded. Moreover, as in Comparative Example 3, in the case of 120 pts. mass of silica being blended to 80 pts. mass of the thermosetting binder, transmittance was reduced and alignment mark readability was degraded. Furthermore, as in Comparative Example 4, in the case of 20 pts. mass of silica being blended to 80 pts. mass of the thermosetting binder, laser mark visibility was degraded. Moreover, as in Comparative Example 5, in the case of 4.0 pts. mass of carbon black being blended to 80 pts. mass of the thermosetting binder, transmittance was reduced and alignment mark readability was degraded. Furthermore, as in Comparative Example 6, in the case of 0.3 pts. mass of carbon black being blended to 80 pts. mass of the thermosetting binder, laser mark visibility was degraded.

In contrast, as in the Examples 1 to 9, by blending a transparent filler having an average primary particle size from 1 to 1000 nm from 30 to 100 pts. mass with respect to 80 pts. mass of the thermosetting binder and the colorant from 0.5 to 3.0 pts. mass with respect to 80 pts. mass of the thermosetting binder, excellent laser mark visibility and alignment mark readability were achieved.

3.2 Second Examples

In the Second Examples, thermosetting adhesive sheets were manufactured and these were applied to a patterned wafer in which warping had occurred, and warping amount was evaluated after curing of the laminate. Furthermore, curing speed, adhesion reliability, alignment mark visibility and dicing tape application properties were evaluated in the thermosetting adhesive sheets.

Thermosetting Adhesive Sheet Manufacturing

The constituents listed below were blended to prepare resin compositions. These were then applied to release-treated PET (polyethylene terephthalate) by using a bar coater and were then dried in an oven at 80° C. for 3 minutes to manufacture thermosetting adhesive sheets having a thickness of 20 μm (cover release-treated PET (25 μm))/thermosetting adhesive sheet (20 μm)/base release-treated PET (50 μm).

FX293: fluorene-type phenoxy resin (manufactured by Nippon Steel Sumikin Chemical Co., Ltd.)

YP-50 bisphenol A type phenoxy resin (manufactured by Nippon Steel Sumikin Chemical Co., Ltd.)

SG-80H: acrylic-type elastomer (manufactured by Nagase ChemteX Co., Ltd.)

RKB-5515B: butadiene-type elastomer (manufactured by RESINOUS KASEI CO., LTD.)

DCP: tricyclodecane dimethanol dimethacrylate (manufactured by SHIN-NAKAMURA CHEMICAL CO, LTD., (meth)acrylic equivalent weight (molecular weight/functional group number)=166)

A-DCP: tricyclodecane dimethanol diacrylate (manufactured by SHIN-NAKAMURA CHEMICAL CO, LTD., (meth)acrylic equivalent weight (molecular weight/functional group number)=166)

M-315: a compound of isocyanuric acid ethylene oxide-modified diacrylate and isocyanuric acid ethylene oxide-modified triacrylate, (isocyanuric acid ethylene oxide-modified diacrylate content from 3 to 13%) (manufactured by Toagosei Co., Ltd., (meth)acrylic equivalent weight (molecular weight/functional group number)=144)

A-DPH: dipentaerythritol hexaacrylate (manufactured by SHIN-NAKAMURA CHEMICAL CO, LTD., (meth)acrylic equivalent weight (molecular weight/functional group number)=96)

UV-1700B: urethane acrylate (manufactured by The Nippon Synthetic Chemical Industry Co., Ltd. (meth)acrylic equivalent weight (molecular weight/functional group number)=222)

4-HBA: 4-hydroxy-butyl acrylate (manufactured by SHIN-NAKAMURA CHEMICAL CO, LTD., (meth)acrylic equivalent weight (molecular weight/number of functional groups)=144)

CEL-2021P: alicyclic epoxy resin (manufactured by Daicel Corporation)

JER1031S: special polyfunctional epoxy resin (Mitsubishi Chemical Corporation)

PEROYL L: Dilauroyl peroxide (manufactured by NOF CORPORATION, one-minute half-life temperature 116.4° C.)

PEROCTA O: 1,1,3,3-tetra-methyl butyl peroxy-2-ethylhexanoate (manufactured by NOF CORPORATION, one-minute half-life temperature: 116.4° C.)

PERHEXA V: n-butyl-4,4-bis(t-butylperoxy) valerate (manufactured by NOF CORPORATION, one-minute half-life temperature: 116.4° C.)

TD-2131: phenol novolac (manufactured by DIC Corporation)

U-CAT5002: DBU-type tetraphenylborate salt (San-Apro Ltd.)

Aerosil R202: silica (NIPPON AEROSIL CO., LTD)

20: carbon black

KBM-5103: acrylic-type silane coupling agent (Shin-Etsu Chemical Co., Ltd.)

KBM-403: epoxy-type silane coupling agent (Shin-Etsu Chemical Co., Ltd.)

Laminate Manufacturing

A 20 µm thick thermosetting adhesive sheet was applied to patterned wafers with a press machine under conditions of 130° C. for one hour to obtain a laminate.

Eight-inch patterned wafers with thicknesses of 200 µm were used. Furthermore, average warping in the patterned wafers (sample size: 10) was 4 mm. It should be noted that warping amount of the patterned wafers was measured as the maximum value of the warp (z-axis) when the patterned wafer was placed on a plane stage (x-y plane).

Laminate Warping Amount Evaluation

In the same manner as in measuring warping amount in the patterned wafers, laminate warping amount was measured as the maximum value of the warp (z-axis) when the laminate was placed on a plane stage (x-y plane). Laminates with less than 1.0 mm of warping were evaluated as VG, laminates with 1.0 mm or more but less than 1.5 mm of warping were evaluated as G, laminates with 1.5 mm or more but less than 2.5 mm of warping were evaluated as Intermediate (hereinafter represented as I) and laminates with 2.5 mm or more of warping were evaluated as F.

Thermosetting Adhesive Sheet Curing Speed Evaluation

A Fourier transform infrared spectrophotometer (FT/IR-4100 manufactured by JASCO Corporation) was used to measure sample thermosetting adhesive sheets having a thickness of 20 µm and cured under conditions of 130° C. for one hour using the transmission method. The reaction ratios of the sample thermosetting adhesive sheets were calculated from the ratio of the measured intensity of the acrylic monomer (unsaturated groups) in un-cured thermosetting adhesive sheets and the measured intensity of the acrylic monomer (unsaturated groups) in thermosetting adhesive sheets after curing completion. A reaction ratio of 80% or more in the thermosetting adhesive sheet was evaluated as VG, a reaction ratio of 50% or more and less than 80% in the thermosetting adhesive sheet was evaluated as G, and a reaction ratio of less than 50% in the thermosetting adhesive sheet was evaluated as F.

Thermosetting Adhesive Sheet Adherence Reliability Evaluation

In the thermosetting adhesive sheets, which had a thickness of 20 µm and which were cured under conditions of 130° C. for one hour, initial adhesive strength and adhesive strength after a reliability test with conditions of a temperature of 85° C., a humidity of 85% and 1000 hours were measured. Adhesive strength was measured in conformity with JIS K 6854 by a 90-degree peel test with a peel rate of 50 mm/min and peel strength was measured as the force required to peel. An adhesive strength after the reliability test of 90% or more of the initial adhesive strength was evaluated as VG, an adhesive strength after the reliability test of 80% or more and less than 90% of the initial adhesive strength was evaluated as G and an adhesive strength after the reliability test of less than 80% of the initial adhesive strength was evaluated as F.

Thermosetting Adhesive Sheet Alignment Mark Readability Evaluation

Transmittance of infrared light (wavelength: 1 µm) was measured in the thermosetting adhesive sheets, which had a thickness of 20 µm and were cured under conditions of 130° C. for one hour. An IR transmittance of 50% or more was evaluated as VG, a transmittance of 30% or more and less than 50% was evaluated as G and a transmittance of less than 30% was evaluated as F.

Dicing Tape Application Properties Evaluation

A dicing tape was laminated to the thermosetting adhesive layer side of the laminate. The dicing tape was visually inspected and the absence of air bubbles was evaluated as G and the presence of air bubbles was evaluated as F.

Example 10

A resin composition was prepared having 5 pts. mass of a fluorene-type phenoxy resin (FX293), 20 pts. mass of an acrylic-type elastomer (SG-80H), 50 pts. mass of a trifunctional acrylate (M-315), 5 pts. mass of an organic peroxide (PEROYL L), 100 pts. mass of silica (Aerosil R202), 1 pt. mass of carbon black and 2 pts. mass of an acrylic-type silane coupling agent (KBM-5103), which had an additive average value of (meth)acrylic equivalent weight of 144 and an average cross-link density of 7.1E-03 and a thermosetting adhesive sheets were manufactured.

As represented in Table 3, the thermosetting adhesive sheets were applied to patterned wafers, and warping after curing of the laminate was evaluated as VG. Furthermore, curing speed was evaluated as VG, adhesion reliability was evaluated as VG, alignment mark visibility was evaluated as VG and dicing tape application properties were evaluated as G for the thermosetting adhesive sheets.

Example 11

Thermosetting adhesive sheets were prepared in the same manner as in Example 10 with the exception that, instead of the trifunctional acrylate (M-315), 50 pts. mass of a bifunctional acrylate (A-DCP) was blended; the additive average value of (meth)acrylic equivalent weight (molecular weight/functional group number) was 152 and average cross-link density was 6.6E-03.

As represented in Table 3, thermosetting adhesive sheets were applied to patterned wafers, and warping amount after curing of the laminate was evaluated as VG. Furthermore, curing speed was evaluated as VG, adhesion reliability was evaluated as VG, and alignment mark visibility was evaluated as VG for the thermosetting adhesive sheets.

Example 12

Thermosetting adhesive sheets were prepared in the same manner as in Example 10 with the exception that, instead of the trifunctional acrylate (M-315), 50 pts. mass of a bifunctional acrylate (DCP) was blended; the additive average value of (meth)acrylic equivalent weight (molecular weight/functional group number) was 166 and average cross-link density was 6.0E-03.

As represented in Table 3, thermosetting adhesive sheets were applied to patterned wafers, and warping amount after curing of the laminate was evaluated as VG. Furthermore, curing speed was evaluated as VG, adhesion reliability was evaluated as VG, and alignment mark visibility was evaluated as VG for the thermosetting adhesive sheets.

Example 13

Thermosetting adhesive sheets were prepared in the same manner as in Example 10 with the exception that, instead of the trifunctional acrylate (M-315), 50 pts. mass of a polyfunctional acrylate (A-DPH) was blended; additive average value of (meth)acrylic equivalent weight (molecular weight/functional group number) was 96 and average cross-link density was 1.0E-02.

As represented in Table 3, thermosetting adhesive sheets were applied to patterned wafers, and warping amount after curing of the laminate was evaluated as VG. Furthermore, curing speed was evaluated as VG, adhesion reliability was evaluated as G and alignment mark visibility was evaluated as VG for the thermosetting adhesive sheets.

Example 14

Thermosetting adhesive sheets were prepared in the same manner as in Example 10 with the exception that, instead of the trifunctional acrylate (M-315), 50 pts. mass of a polyfunctional urethane acrylate (UV-1700B) was blended; the additive average value of (meth)acrylic equivalent weight (molecular weight/functional group number) was 222 and average cross-link density was 4.5E-03.

As represented in Table 3, thermosetting adhesive sheets were applied to patterned wafers, and warping amount after curing of the laminate was evaluated as VG. Furthermore, curing speed was evaluated as VG, adhesion reliability was evaluated as G and alignment mark visibility was evaluated as VG for the thermosetting adhesive sheets.

Example 15

Thermosetting adhesive sheets were prepared in the same manner as in Example 10 with the exception that, instead of the trifunctional acrylate (M-315), 20 pts. mass of a polyfunctional methacrylate (A-DPH) and 30 pts. mass of a monofunctional acrylate (4-HBA) was blended; the additive average value of (meth)acrylic equivalent weight (molecular weight/functional group number) was 125 and average cross-link density was 8.3E-03.

As represented in Table 3, thermosetting adhesive sheets were applied to patterned wafers, and warping amount after curing of the laminate was evaluated as G. Furthermore, curing speed was evaluated as VG, adhesion reliability was evaluated as G and alignment mark visibility was evaluated as VG for the thermosetting adhesive sheets.

Example 16

Thermosetting adhesive sheets were prepared in the same manner as in Example 10 with the exception that, instead of the trifunctional acrylate (M-315), 70 pts. mass of a polyfunctional acrylate (A-DPH) was blended; the additive average value of (meth)acrylic equivalent weight (molecular weight/functional group number) was 96 and average cross-link density was 1.0E-02.

As represented in Table 3, thermosetting adhesive sheets were applied to patterned wafers, and warping amount after curing of the laminate was evaluated as VG. Furthermore, curing speed was evaluated as G, adhesion reliability was evaluated as G and alignment mark visibility was evaluated as VG for the thermosetting adhesive sheets.

Example 17

Thermosetting adhesive sheets were prepared in the same manner as in Example 10 with the exception that, 30 pts. mass of a trifunctional acrylate (M-315), 18 pts. mass of a bifunctional methacrylate (DCP) and 2 pts. mass of a monofunctional acrylate (4-HBA) were blended; the additive average value of (meth)acrylic equivalent weight (molecular weight/functional group number) was 125 and average cross-link density was 6.7E-03.

As represented in Table 3, thermosetting adhesive sheets were applied to patterned wafers, and warping amount after curing of the laminate was evaluated as VG. Furthermore, curing speed was evaluated as VG, adhesion reliability was evaluated as VG, and alignment mark visibility was evaluated as VG for the thermosetting adhesive sheets.

Example 18

Thermosetting adhesive sheets were prepared in the same manner as in Example 10 with the exception that 3 pts. mass of a fluorene-type phenoxy resin (FX293) and 2 pts. mass of a bisphenol A epoxy resin (YP-50) were blended; the additive average value of (meth)acrylic equivalent weight (molecular weight/functional group number) was 144 and average cross-link density was 7.1E-03.

As represented in Table 3, thermosetting adhesive sheets were applied to patterned wafers, and warping amount after curing of the laminate was evaluated as G. Furthermore, curing speed was evaluated as VG, adhesion reliability was evaluated as G and alignment mark visibility was evaluated as VG for the thermosetting adhesive sheets.

Example 19

Thermosetting adhesive sheets were prepared in the same manner as in Example 10 with the exception that a fluorene-type phenoxy resin (FX293) was not included and 25 pts. mass of an acrylic-type elastomer (SG-80H) was blended; the additive average value of (meth)acrylic equivalent weight (molecular weight/functional group number) was 144 and average cross-link density was 7.1E-03.

As represented in Table 3, thermosetting adhesive sheets were applied to patterned wafers, and warping amount after curing of the laminate was evaluated as G. Furthermore, curing speed was evaluated as VG, adhesion reliability was evaluated as VG, and alignment mark visibility was evaluated as VG for the thermosetting adhesive sheets.

Example 20

Thermosetting adhesive sheets were prepared in the same manner as in Example 10 with the exception that 15 pts. mass of an acrylic-type elastomer (SG-80H) and 5 pts. mass of a butadiene-based elastomer (RKB-5515B) were blended; the additive average value of (meth)acrylic equivalent weight (molecular weight/functional group number) was 144 and average cross-link density was 7.1E-03.

As represented in Table 3, thermosetting adhesive sheets were applied to patterned wafers, and warping amount after curing of the laminate was evaluated as VG. Furthermore, curing speed was evaluated as VG, adhesion reliability was evaluated as G and alignment mark visibility was evaluated as G for the thermosetting adhesive sheets.

Comparative Example 7

Thermosetting adhesive sheets were prepared in the same manner as in Example 10 with the exception that instead of the acrylic-type elastomer (SG-80H), 20 pts. mass of a butadiene-based elastomer (RKB-5515B) was blended; the additive average value of (meth)acrylic equivalent weight (molecular weight/functional group number) was 144 and average cross-link density was 7.1E-03.

As represented in Table 3, thermosetting adhesive sheets were applied to patterned wafers, and warping amount after curing of the laminate was evaluated as G. Furthermore, curing speed was evaluated as VG, adhesion reliability was evaluated as G and alignment mark visibility was evaluated as F for the thermosetting adhesive sheets.

Example 21

Thermosetting adhesive sheets were prepared in the same manner as in Example 10 with the exception that, instead of PEROYL L, 5 pts. mass of PEROCTA O was blended; the additive average value of (meth)acrylic equivalent weight (molecular weight/functional group number) was 144 and average cross-link density was 7.1E-03.

As represented in Table 4, thermosetting adhesive sheets were applied to patterned wafers, and warping amount after curing of the laminate was evaluated as VG. Furthermore, curing speed was evaluated as VG, adhesion reliability was evaluated as VG and alignment mark visibility was evaluated as VG for the thermosetting adhesive sheets.

Example 22

Thermosetting adhesive sheets were prepared in the same manner as in Example 10 with the exception that 4 pts. mass of PEROYL L and 1 pts. mass of PERHEXA V were blended; the average additive average value of (meth)acrylic equivalent weight (molecular weight/functional group number) was 144 and average cross-link density was 7.1E-03.

As represented in Table 4, thermosetting adhesive sheets were applied to patterned wafers, and warping amount after curing of the laminate was evaluated as VG. Furthermore, curing speed was evaluated as I, adhesion reliability was evaluated as VG and alignment mark visibility was evaluated as VG for the thermosetting adhesive sheets.

Example 23

Thermosetting adhesive sheets were prepared in the same manner as in Example 10 with the exception that, instead of trifunctional acrylate (M-315), PEROYL L and acrylic-type silane coupling agent (KBM-5103), 50 pts. mass of an alicyclic epoxy resin (CEL-2021P), 5 pts. mass of a phenol novolac (TD-2131), 5 pts. mass of a DBU-type tetraphenylborate salt (U-CAT 5002) and 2 pts. mass of an epoxy-type silane coupling agent (KBM-403) were blended to create the resin composition.

As represented in Table 4, thermosetting adhesive sheets were applied to patterned wafers, and warping amount after curing of the laminate was evaluated as I. Furthermore, curing speed was evaluated as F, adhesion reliability was evaluated as VG, and alignment mark visibility was evaluated as G for the thermosetting adhesive sheets.

Example 24

Thermosetting adhesive sheets were prepared in the same manner as in Example 10 with the exception that, instead of the trifunctional acrylate (M-315), PEROYL L and acrylic-type silane coupling agent (KBM-5103), 50 pts. mass of a special polyfunctional epoxy resin (JER1031S), 5 pts. mass of a phenol novolac (TD-2131), 5 pts. mass of a DBU-type tetraphenylborate salt (U-CAT 5002) and 2 pts. mass of an epoxy-type silane coupling agent (KBM-403) were blended to prepare the resin composition.

As represented in Table 4, thermosetting adhesive sheets were applied to patterned wafers, and warping amount after curing of the laminate was evaluated as I. Furthermore, curing speed was evaluated as F, adhesion reliability was evaluated as VG, alignment mark visibility was evaluated as G and dicing tape application properties were evaluated as F for the thermosetting adhesive sheets.

Example 25

Thermosetting adhesive sheets were prepared in the same manner as in Example 10 with the exception that, instead of the trifunctional acrylate (M-315), 50 pts. mass of a monofunctional acrylate (4-HBA) was blended; the additive average value of (meth)acrylic equivalent weight (molecular weight/functional group number) was 144 and average cross-link density was 6.9E-03.

As represented in Table 4, thermosetting adhesive sheets were applied to patterned wafers, and warping amount after curing of the laminate was evaluated as F. Furthermore, curing speed was evaluated as VG, adhesion reliability was evaluated as G, alignment mark visibility was evaluated as VG and dicing tape application properties were evaluated as F for the thermosetting adhesive sheets.

Example 26

Thermosetting adhesive sheets were prepared in the same manner as in Example 10 with the exception that 47.5 pts. mass of a trifunctional acrylate (M-315) and 2.5 pts. mass of a monofunctional acrylate (4-HBA) were blended; the additive average value of (meth)acrylic equivalent weight (molecular weight/functional group number) was 102 and average cross-link density was 7.1E-03.

As represented in Table 4, thermosetting adhesive sheets were applied to patterned wafers, and warping amount after curing of the laminate was evaluated as I. Furthermore, curing speed was evaluated as VG, adhesion reliability was evaluated as VG, and alignment mark visibility was evaluated as VG for the thermosetting adhesive sheets.

Example 27

Thermosetting adhesive sheets were prepared in the same manner as in Example 10 with the exception that, in place of PEROYL L, 5 pts. mass of PERHEXA V was blended; the additive average value of (meth)acrylic equivalent weight (molecular weight/functional group number) was 144 and average cross-link density was 7.1E-03.

As represented in Table 4, thermosetting adhesive sheets were applied to patterned wafers, and warping amount after curing of the laminate was evaluated as I. Furthermore, curing speed was evaluated as F, adhesion reliability was evaluated as VG, and alignment mark visibility was evaluated as VG for the thermosetting adhesive sheets.

TABLE 3

| Component | Trade Name | Ex. 10 | Ex. 11 | Ex. 12 | Ex. 13 | Ex. 14 | Ex. 15 |
|---|---|---|---|---|---|---|---|
| fluorene-type phenoxy resin | FX293 | 5 | 5 | 5 | 5 | 5 | 5 |
| butadiene-based elastomer | YP-50 | — | — | — | — | — | — |
| acrylic elastomer | SG-80H | 20 | 20 | 20 | 20 | 20 | 20 |
| butadiene-based elastomer | RKB-5515B | — | — | — | — | — | — |
| bifunctional methacrylate | DCP | — | — | 50 | — | — | — |
| bifunctional acrylata | A-DCP | — | 50 | — | — | — | — |
| trifunctional acrylate | M-315 | 50 | — | — | — | — | — |
| polyfunctional acrylate | A-DPH | — | — | — | 50 | — | 20 |
| polyfunctional acrylate | UV-1700B | — | — | — | — | 50 | — |
| monofunctional acrylate | 4-HBA | — | — | — | — | — | — |
| alicyclic epoxy resin | CEL-2021P | — | — | — | — | — | — |
| special polyfunctional epoxy resin | JER 1031S | — | — | — | — | — | — |
| dilauroyl peroxide | PEROYL L | 5 | 5 | 5 | 5 | 5 | 5 |
| poeroxyester | PEROCTA O | — | — | — | — | — | — |
| peroxy ketal | PERHEXA V | — | — | — | — | — | — |
| phenol novolac | TD-2131 | — | — | — | — | — | — |
| DBU-type tetraphenylborate salt | U-CAT 5002 | — | — | — | — | — | — |
| silica (primary particle diameter: 14 nm) | AEROSIL R202 | 100 | 100 | 100 | 100 | 100 | 100 |
| carbon black | #20 | 1 | 1 | 1 | 1 | 1 | 1 |
| acrylic-type silane coupling agent | KBM-5103 | 2 | 2 | 2 | 2 | 2 | 2 |
| epoxy-type silane coupling agent | KBM-403 | — | — | — | — | — | — |
| (Meth)Acrylic Equivalent Weight Additive Average | | 144 | 152 | 166 | 96 | 222 | 96 |
| Average Cross-link Density | | 7.1E−03 | 5.6E−03 | 6.0E−03 | 1.0E−02 | 4.5E−03 | 1.0E−02 |
| Laminate Warping Evaluation | | VG | VG | VG | VG | VG | G |
| Curing Speed Evaluation | | VG | VG | VG | VG | VG | VG |
| Adherence Reliability Evaluation | | VG | VG | VG | G | G | G |
| Alignment Mark Visibility Evaluation | | VG | VG | VG | VG | VG | VG |
| Dicing Tape Application Evaluation | | G | — | — | — | — | — |

| Component | Trade Name | Ex. 16 | Ex. 17 | Ex. 18 | Ex. 19 | Ex. 20 | Comp. 7 |
|---|---|---|---|---|---|---|---|
| fluorene-type phenoxy resin | FX293 | 5 | 5 | 3 | — | 5 | 5 |
| butadiene-based elastomer | YP-50 | — | — | 2 | — | — | — |
| acrylic elastomer | SG-80H | 20 | 20 | 20 | 25 | 15 | — |
| butadiene-based elastomer | RKB-5515B | — | — | — | — | 5 | 20 |
| bifunctional methacrylate | DCP | — | 18 | — | — | — | — |
| bifunctional acrylata | A-DCP | — | — | — | — | — | — |
| trifunctional acrylate | M-315 | — | 30 | 50 | 50 | — | 50 |
| polyfunctional acrylate | A-DPH | 70 | — | — | — | — | — |
| polyfunctional acrylate | UV-1700B | — | — | — | — | — | — |
| monofunctional acrylate | 4-HBA | — | 2 | — | — | — | — |
| alicyclic epoxy resin | CEL-2021P | — | — | — | — | — | — |
| special polyfunctional epoxy resin | JER 1031S | — | — | — | — | — | — |
| dilauroyl peroxide | PEROYL L | 5 | 5 | 5 | 5 | 5 | 5 |
| poeroxyester | PEROCTA O | — | — | — | — | — | — |
| peroxy ketal | PERHEXA V | — | — | — | — | — | — |
| phenol novolac | TD-2131 | — | — | — | — | — | — |
| DBU-type tetraphenylborate salt | U-CAT 5002 | — | — | — | — | — | — |
| silica (primary particle diameter: 14 nm) | AEROSIL R202 | 100 | 100 | 100 | 100 | 100 | 100 |
| carbon black | #20 | 1 | 1 | 1 | 1 | 1 | 1 |
| acrylic-type silane coupling agent | KBM-5103 | 2 | 2 | 2 | 2 | 2 | 2 |
| epoxy-type silane coupling agent | KBM-403 | — | — | — | — | — | — |
| (Meth)Acrylic Equivalent Weight Additive Average | | 96 | 125 | 144 | 144 | 144 | 144 |
| Average Cross-link Density | | 1.0E−02 | 6.7E−03 | 7.1E−03 | 7.1E−03 | 7.1E−03 | 7.1E−03 |
| Laminate Warping Evaluation | | VG | VG | G | G | VG | G |
| Curing Speed Evaluation | | G | VG | VG | VG | VG | VG |
| Adherence Reliability Evaluation | | G | VG | G | VG | G | G |
| Alignment Mark Visibility Evaluation | | VG | VG | VG | VG | G | F |
| Dicing Tape Application Evaluation | | — | — | — | — | — | — |

TABLE 4

| Component | Trade Name | Ex. 21 | Ex. 22 | Ex. 23 | Ex. 24 | Ex. 25 | Ex. 26 | Ex. 27 |
|---|---|---|---|---|---|---|---|---|
| fluorene-type phenoxy resin | FX293 | 5 | 5 | 5 | 5 | 5 | 5 | 5 |
| butadiene-based elastomer | YP-50 | — | — | — | — | — | — | — |
| acrylic elastomer | SG-80H | 20 | 20 | 20 | 20 | 20 | 20 | 20 |
| butadiene-based elastomer | RKB-5515B | — | — | — | — | — | — | — |
| bifunctional methacrylate | DCP | — | — | — | — | — | — | — |
| bifunctional acrylate | A-DCP | — | — | — | — | — | — | — |
| trifunctional acrylate | M-315 | 50 | 50 | — | — | — | 47.5 | 50 |

TABLE 4-continued

| Component | Trade Name | Ex. 21 | Ex. 22 | Ex. 23 | Ex. 24 | Ex. 25 | Ex. 26 | Ex. 27 |
|---|---|---|---|---|---|---|---|---|
| polyfunctional acrylate | A-DPH | — | — | — | — | — | — | — |
| monofunctional acrylate | 4-HBA | — | — | — | — | 50 | 2.5 | — |
| alicyclic epoxy resin | CEL-2021P | — | — | 50 | — | — | — | — |
| special polyfunctional epoxy resin | JER 1031S | — | — | — | 50 | — | — | — |
| dilauroyl peroxide | PEROYL L | — | 4 | — | — | 5 | 5 | — |
| poeroxyester | PEROCTA O | 5 | — | — | — | — | — | — |
| peroxy ketal | PERHEXA V | — | 1 | — | — | — | — | 5 |
| phenol novolac | TD-2131 | — | — | 5 | 5 | — | — | — |
| DBU-type tetraphenylborate salt | U-CAT 5002 | — | — | 5 | 5 | — | — | — |
| silica (primary particle dia: 14 nm) | AEROSIL R202 | 100 | 100 | 100 | 100 | 100 | 100 | 100 |
| carbon black | #20 | 1 | 1 | 1 | 1 | 1 | 1 | 1 |
| acrylic silane coupling agent | KBM-5103 | 2 | 2 | — | — | 2 | 2 | 2 |
| epoxy silane coupling agent | KBM-403 | — | — | 2 | 2 | — | — | — |
| (Meth)Acrylic Equivalent Additive Average | | 144 | 144 | — | — | 144 | 102 | 144 |
| Average Cross-link Density | | 7.1E−03 | 7.1E−03 | — | — | 6.9E−03 | 7.1E−03 | 7.1E−03 |
| Laminate Warping Evaluation | | VG | VG | I | I | F | I | I |
| Curing Speed Evaluation | | VG | I | F | F | VG | VG | F |
| Adherence Reliability Evaluation | | VG | VG | VG | VG | G | VG | VG |
| Alignment Mark Visibility Evaluation | | VG | VG | G | G | VG | VG | VG |
| Dicing Tape Application Properties | | — | — | — | F | F | — | — |

As in Examples 10 to 27, by blending 100 pts. mass of a silica filler having an average primary particle size of 14 nm and 1 pt. mass of carbon black, excellent alignment visibility as achieved.

Furthermore, as in examples 10 to 22, in the case of blending a polymer including an elastomer, a (meth)acrylate in which polyfunctional (meth)acrylate exceeds 95 wt % of the total (meth)acrylate content and an organic peroxide having a one-minute half-life temperature of 130° C. or less, a high curing speed could be achieved, a large stress opposing the direction of wafer warping was generated and it was possible to significantly reduce wafer warping.

Still further, constituents other than polyfunctional (meth) acrylate were similar, as can be understood by comparing Examples 10 to 14, by additive average value of (meth) acrylic equivalent weight being from 100 to 200 g/eq, warping, curing speed, adhesion and alignment mark visibility had favorable evaluations.

Furthermore, as can be understood by comparing Examples 13, 15 and 16, in which the constituents are the same but the blending amount of poly(meth)acrylate differs, by blending 30 pts. mass or more of poly(meth)acrylate, warping amount of the laminate had a favorable evaluation.

REFERENCE SIGNS LIST

11 matrix film layer, 12 thermosetting adhesive layer, 21 wafer, 22 protruding electrodes, 30 protective tape, 31 thermoplastic resin layer, 32 matrix film layer

The invention claimed is:

1. A thermosetting adhesive sheet to be applied to a grinding-side surface of a semiconductor wafer before dicing the semiconductor wafer, comprising:
   a thermosetting binder;
   a transparent filler having an average primary particle diameter from 1 nm to 1000 nm; and a colorant;
   wherein content of the transparent filler is from 30 to 100 parts by weight with respect to 80 parts by weight of the thermosetting binder, and content of the colorant is from 0.5 to 3.0 parts by weight with respect to 80 parts by weight of the thermosetting binder, and
   the thermosetting binder comprises a polymer comprising an elastomer, a (meth)acrylate in which polyfunctional (meth)acrylate exceeds 95 wt % of the total (meth) acrylate content and an organic peroxide having a one-minute half-life temperature of 130° C. or less.

2. The thermosetting adhesive sheet according to claim 1, wherein:
   the transparent filler is silica; and
   the colorant is carbon black.

3. The thermosetting adhesive sheet according to claim 2, wherein an additive average value of (meth)acrylic equivalent weight of the (meth)acrylate is from 80 g/eq to 200 g/eq.

4. The thermosetting adhesive sheet according to claim 2, wherein content of the (meth)acrylate is from 20 to 70 parts by weight with respect to 25 parts by weight of the polymer.

5. The thermosetting adhesive sheet according to claim 1, wherein an additive average value of (meth)acrylic equivalent weight of the (meth)acrylate is from 80 g/eq to 200 g/eq.

6. The thermosetting adhesive sheet according to claim 5, wherein the polymer comprises a fluorene-type phenoxy resin and an acrylic-type elastomer.

7. The thermosetting adhesive sheet according to claim 5, wherein the organic peroxide comprises dilauroyl peroxide.

8. The thermosetting adhesive sheet according to claim 1, wherein content of the (meth)acrylate is from 20 to 70 parts by weiqht with respect to 25 parts by weight of the polymer.

9. The thermosetting adhesive sheet according to claim 8, wherein the polymer comprises a fluorene-type phenoxy resin and an acrylic-type elastomer.

10. The thermosetting adhesive sheet according to claim 8, wherein the organic peroxide comprises dilauroyl peroxide.

11. The thermosetting adhesive sheet according to claim 1, wherein the polymer comprises a fluorene-type phenoxy resin and an acrylic-type elastomer.

12. The thermosetting adhesive sheet according to claim 11, wherein the organic peroxide comprises dilauroyl peroxide.

13. The thermosetting adhesive sheet according to claim 1, wherein the organic peroxide comprises dilauroyl peroxide.

14. A method for manufacturing a semiconductor device comprising:
   a grinding step of grinding a semiconductor wafer;
   a thermosetting adhesive sheet application step of applying a thermosetting adhesive sheet to a grinding-side surface of the semiconductor wafer;
   a curing step of curing the thermosetting adhesive sheet;

a dicing tape application step of applying a dicing tape to the surface of the semiconductor wafer to which the thermosetting adhesive sheet is applied; and a dicing step of dicing the semiconductor wafer having the dicing tape applied thereon to obtain individual semiconductor chips;

wherein the thermosetting adhesive sheet comprises a thermosetting binder, a transparent filler having an average primary particle diameter from 1 nm to 1000 nm, and a colorant, content of the transparent filler is from 30 to 100 parts by weight with respect to 80 parts by weight of the thermosetting binder, and content of the colorant is from 0.5 to 3.0 parts by weight with respect to 80 parts by weight of the thermosetting binder, and the thermosetting binder comprises a polymer comprising an elastomer, a (meth)acrylate in which polyfunctional (meth)acrylate exceeds 95 wt % of the total (meth)acrylate content and an organic peroxide having a one-minute half-life temperature of 130° C. or less.

* * * * *